United States Patent [19]

Roemer et al.

[11] Patent Number: 5,063,349
[45] Date of Patent: Nov. 5, 1991

[54] TRANSFORMER-COUPLED GRADIENT SPEED-UP CIRCUIT

[75] Inventors: Peter B. Roemer, Schenectady; Otward M. Mueller, Ballston Lake; John N. Park, Rexford; William McMurray, Schenectady, all of N.Y.

[73] Assignee: General Electric Company, Schenectady, N.Y.

[21] Appl. No.: 533,233

[22] Filed: Jun. 4, 1990

[51] Int. Cl.$^5$ .................................................. G01R 33/20
[52] U.S. Cl. ..................................... 324/322; 324/318
[58] Field of Search ............... 324/300, 307, 309, 318, 324/322; 128/653 A

[56] References Cited

U.S. PATENT DOCUMENTS 4,961,054 10/1990 Park et al. ........................... 324/322
5,017,871 5/1991 Mueller et al. ....................... 324/318

Primary Examiner—Michael J. Tokar
Attorney, Agent, or Firm—Marvin Snyder; James C. Davis, Jr.

[57] ABSTRACT

A gradient current speed-up circuit, for use in a higher-speed NMR imaging system having an associated gradient coil, has a gradient power amplifier receiving an input analog signal controlling amplifier output current, and a transformer having a primary winding and a pair of secondary windings connected in series with the amplifier output and the coil. Semiconductor switching elements selectively connect the primary winding between first and second potential sources, and are turned on and off in selected patterns to cause a current to be suddenly applied to, and removed from, flow through the associated gradient coil; the amplifier output current is changed with the gradient coil current lags behind an amplitude commanded by a master input signal.

15 Claims, 2 Drawing Sheets

TRANSFORMER-COUPLED GRADIENT SPEED-UP CIRCUIT

BACKGROUND OF THE INVENTION

The present invention relates to nuclear magnetic resonance (NMR) imaging systems and, more particularly, to a novel circuit for speeding up the rise and fall times of current pulses utilized to generate gradient magnetic fields in such systems.

It is now well known that NMR imaging and/or spectroscopy systems require at least one power amplifier for each magnetic gradient field direction utilized. These gradient power amplifiers provide the current which generates the magnetic gradient fields, typically in the X, Y and Z dimensions of a Cartesian coordinate system, as necessary to obtain desired spatial resolution. Typically, the gradient power amplifiers are modified forms of linear high-fidelity audio power amplifiers, which typically generate current pulses in the 100-200 ampere range; the relatively good linearity, rise times and fall times of these amplifiers are obtained by the application of relatively high voltages and feedback to output stages containing as many as 100 bipolar transistors. These power amplifiers are relatively inefficient (having typical efficiencies of less than 15%). As higher imaging speeds are utilized, greater electrical stress is applied to existing gradient power amplifiers, as faster rise times require greater voltages (across the same gradient coil inductance) and so increasingly higher voltages and more power dissipation are all required. It is therefore highly desirable to provide a current amplifier circuit, preferably capable of being added to an NMR system in addition to, and between, an existing gradient power amplifier and its associated gradient coil, for providing the faster pulse current waveform rise and fall times necessary for higher-speed imaging use.

One such speed-up circuit is described and claimed in U.S. application Ser. No. 07/407,180, filed Sept. 14, 1989, assigned to the assignee of the present invention and incorporated herein in its entirety by reference; this speed-up circuit is relatively expensive. Additionally, the circuit does not allow a DC current to flow for shimming purposes. This lack of precise waveform control is also desirably overcome in any new high speed gradient circuit. Such a circuit would operate with a typical conventional whole body gradient coil, which presently has an inductance of about 1 mH, a resistance on the order of 1 ohm and can produce a 1 Gauss/cm gradient field strength at a coil current flow of about 100 amperes. Note that, ignoring resistance, a gradient strength of 1 G/cm will result in about 400 microseconds with an application of 250 volts to the coil. For snapshot imaging, in which an entire image is a acquired in 30 milliseconds or less, gradient strengths on the order of 3 G/cm, with rise times less than 100 microseconds, are required; use of voltages greater than 3 KV and currents of about 300 A are necessary to achieve such speed. Accordingly, a gradient magnetic field speed-up circuit allowing precise control during ramp waveform portions and providing for DC shim currents and the like, is highly desirable.

BRIEF SUMMARY OF THE INVENTION

In accordance with the invention, a gradient current speed-up circuit for use in a higher-speed NMR imaging system having an associated gradient coil, comprises: a gradient power amplifier receiving an input analog signal controlling amplifier output current; a transformer having a primary winding and a pair of secondary windings connected in series with the amplifier output and the coil; a plurality of semiconductor switching elements for connecting the primary winding between selected first and second potential sources; means for turning the semiconductor devices on and off in selected patterns to cause a current to be suddenly applied to, and removed from, flow through the associated gradient coil; and means for providing to said amplifier input a signal changing the amplifier output current when the gradient coil current lags behind an amplitude commanded by a master input signal.

In a presently preferred embodiment, a single transformer with a pair of secondary windings is used, where the transformer primary-to-secondary windings turns ratio is 2:1.

Accordingly, it is an object of the present invention to provide a novel gradient current speed-up circuit for use in NMR imaging and spectroscopy systems.

This and other objects of the present invention will become apparent upon reading of the following detailed description, when considered in conjunction with the associated drawings.

DETAILED DESCRIPTION OF THE INVENTION

Figure 1:
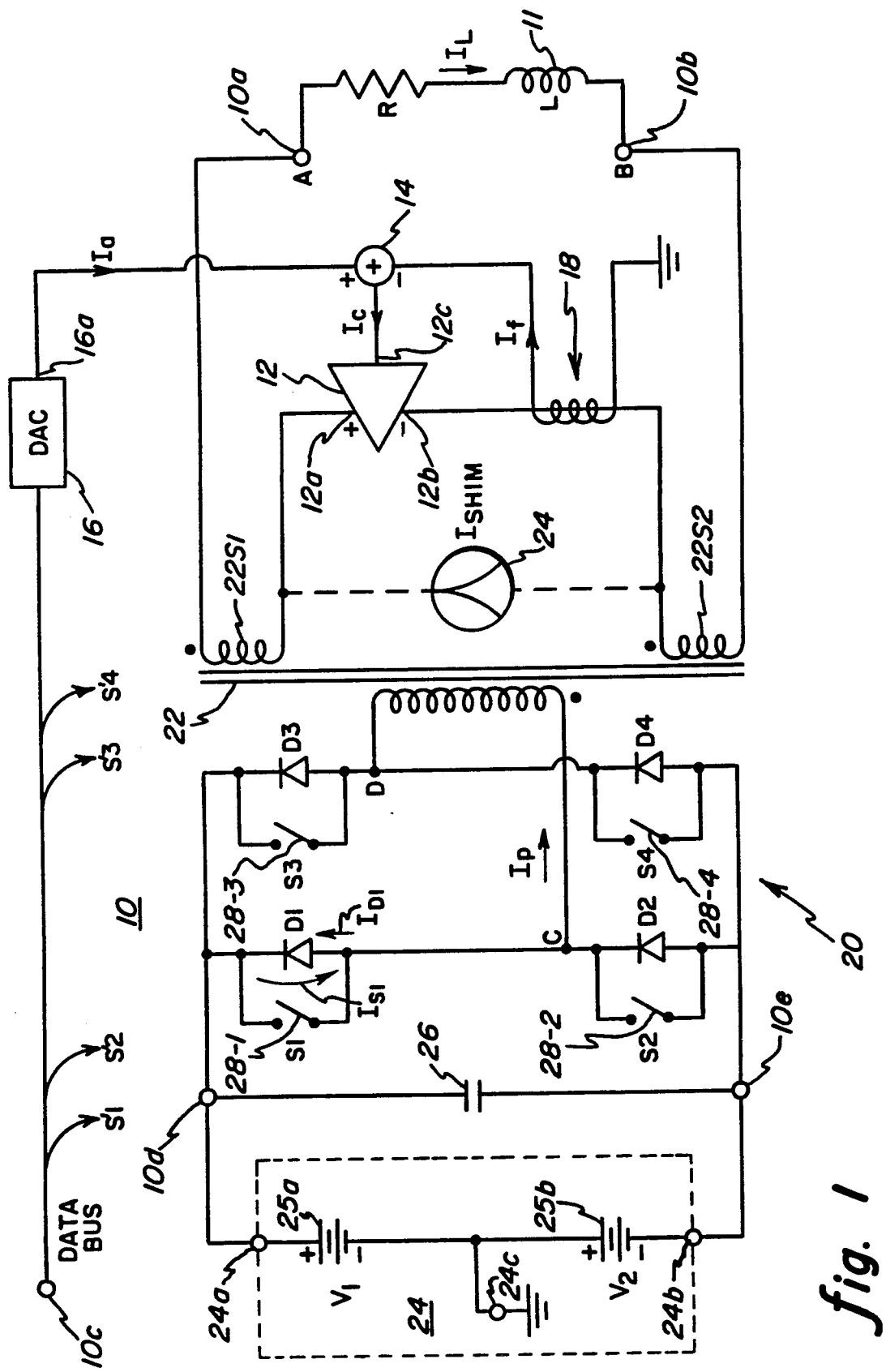
FIG. 1 is a schematic block diagram of a single directional-gradient-magnetic-field-providing portion of a NMR system, and of a presently preferred embodiment of the novel circuit of the present invention.

Referring initially to FIG. 1, a presently preferred embodiment of our gradient current speed-up circuit is utilized with an associated gradient coil 11, connected between circuit A and B terminals 10a and 10b, for providing the magnetic-field gradient in one (of a plurality) of directions within the operating volume of a NMR imaging and/or spectroscopy system. Gradient coil 11 is driven, in part, by a gradient power amplifier 12. One possible gradient power amplifier is the model 8607 bipolar power supply manufactured by Tecron; because a maximum output voltage of about $\pm 160$ volts and a peak output current of about $\pm 130$ amperes is typical for such amplifier/supply units, several units may have to be connected in series/parallel, to supply high voltages/currents needed at the composite amplifier output 12a/12b. The input 12c of each gradient amplifier 12 receives, in parallel, an analog input current $I_c$. This current is provided by a summer (+) means 14 which subtracts a feedback current $I_f$ from a command current $I_a$. The command current is provided from the analog output 16a of a digital-to-analog converter (DAC) means 16. The feedback current $I_f$ is provided from a current sensor means 18, such as a current transformer and the like. The DAC 16 receives an m-bit digital data input control signal at a circuit input 10c, from a system data bus.

In accordance with the invention, a power switching means 20 controls the flow of switching current $I_p$ through a primary winding $22_p$ of a transformer means 22, having first and second secondary windings 22S1 and 22S2, respectively, connected in series with gradient coil 11, between the composite gradient amplifier 12 positive output 12a and negative output 12b. Advantageously, each secondary winding 22S1/22S2 has half as many turns as the transformer primary winding 22p, so that the turns ratio between primary winding and each secondary winding is 2:1. Also in accordance with the invention, a shim Current $I_{SHIM}$ is effectively provided by means 12, in a manner as if a sourcing means 24 were coupled between the adjacent interior secondary winding ends, i.e. from the junction of first secondary winding 22S1 and the amplifier positive output 12a and from the end of second secondary winding 22S2 adjacent amplifier negative output 12b, but after current sensor 18 thereat. Thus, this configuration allows a DC shimming current to be caused to flow through both the transformer secondary windings and gradient coil 11, in either direction, and with an amplitude as required, responsive to a DC term introduced into $I_a$ via data to DAC means 16. Polarity and amplitude of the shim current is thus controllable completely separate from the gradient current applied to coil 11.

Means 20 utilizes a power supply means 24 to provide a high voltage between terminals 24a and 24b; means 24 can contain first and second power supplies 25a and 25b, with respective amplitudes $V_1$ and $V_2$, which may, but need not, be variable, and may be programmable, via the data bus. The power supplies are so polled so as to cause a first circuit supply terminal 10d to be at a positive polarity with respect to the negative polarity of the potential at a second circuit supply terminal 10e; a common circuit connection 24c may be present, but need not be placed as shown. If desired, a storage element 26, such as a capacitor and the like, can be connected between terminals 10d and 10e. A plurality of power switching means 28-1 to 28-4 control the direction of the flow of primary winding current $I_p$, and therefore of gradient current $I_L$ through the gradient coil 11. In one presently preferred configuration, four switch means 28-1 through 28-4 (which may each be a semiconductor switching element S1-S4 with a parallel-connected commutating diode D1-D4) are utilized in a full-bridge configuration; thus, a first power switching means 28-1, controlled by a first control signal S'1, is connected between positive supply terminal 10d and first winding terminal C, which terminal is controllably connectable to circuit negative terminal 10e through a second power switching means 28-2, itself controlled by a second independent control signal S'2. Similarly, upper and lower power switching means 28-3 and 28-4 are connected in series between terminal 10d, second winding terminal D and terminal 10e, and are respectively operated by independent control signals S'3 and S'4. All of signals S'1-S'4 can be supplied via the data bus at circuit control input 10c. If switching means 28 utilizes semiconductor switches, which typically can only switch current off in one direction, then the reverse protection diodes are required. As long as current can flow in both directions, through each leg from one of terminals 10d or 10e to one of terminals C or D, arbitrary staircase type waveforms of gradient coil current $I_L$ can be provided, as well as regulation, with associated current feedback, of the detailed shape of the ramp and flat-top portions of gradient signals, in addition to any shim current applied to the coil. Further, this circuit allows for gradient current compensation, i.e. a technique to modify the shape of the gradient current waveform, typically on the order of 1 percent, to compensate for eddy currents induced in the NMR system cryostat.

Figure 2:
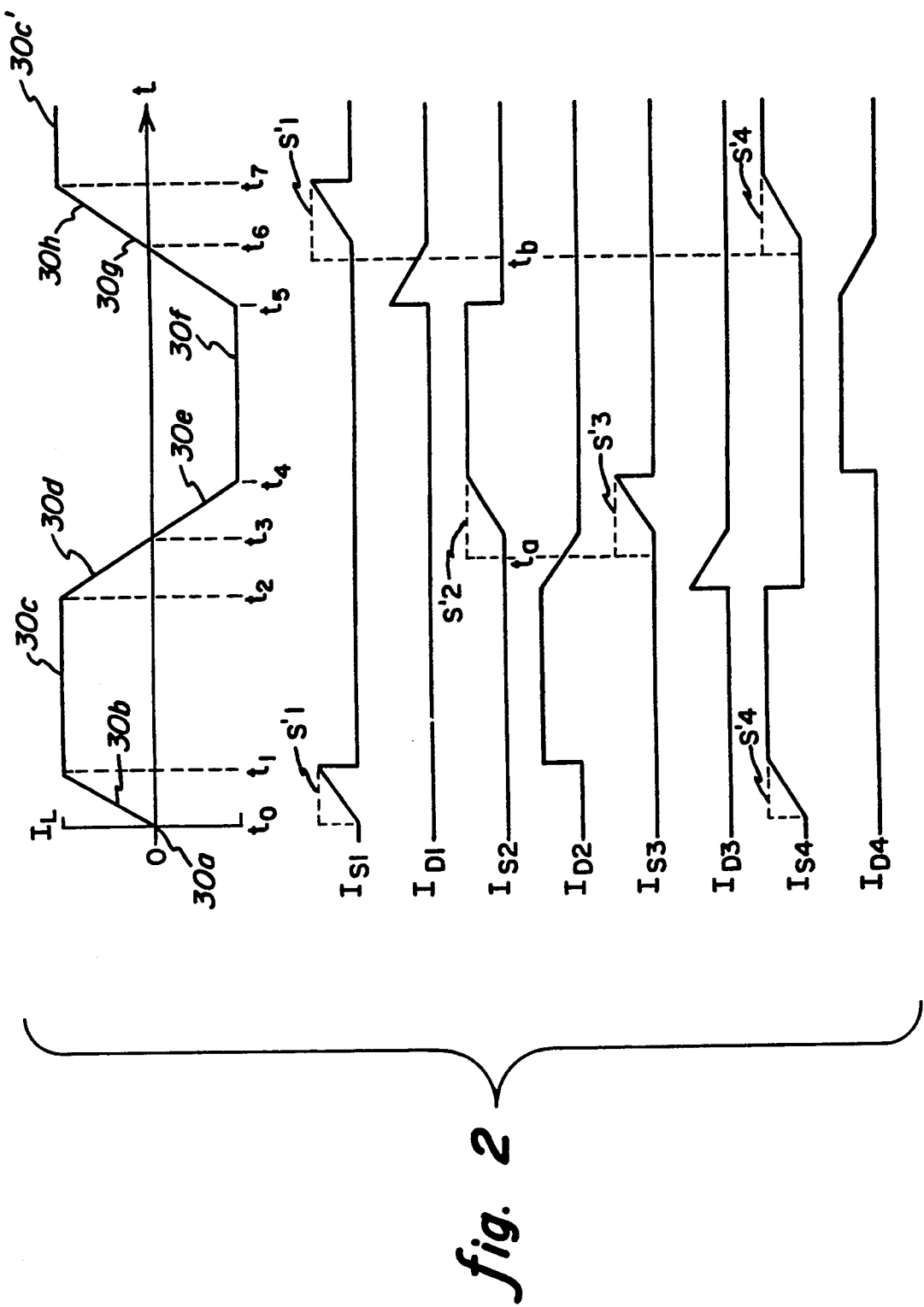
FIG. 2 is a time-synchronized set of signals found in the circuit of FIG. 1 and useful in appreciating operation thereof.

Referring now to FIGS. 1 and 2, the operation of our speed-up circuit can be understood by consideration of the switching necessary to produce a gradient coil current signal waveform 30. Initially, a first current portion 30a, prior to start time $t_O$, is of zero amplitude. A current $I_L$ ramp portion 30b increases from zero to a positive value, achieved at time $t_1$. The positive value is held substantially constant during a flat-top portion 30c, from time $t_1$ through time $t_2$, at which time a ramp-down current portion 30d occurs, with the current reaching a zero amplitude at time $t_3$. Thereafter, the coil current continues to decrease in a negative-polarity down-ramp portion 30e, from time $t_3$ to time $t_4$, at which time a negative-polarity flat-top portion 30f is achieved and held until time $t_5$. Thereafter, a positive-ramp, negative-polarity portion 30g occurs, ending at time $t_6$, when the current is back at zero. Further waveform ramp portions, such as ramp 30h, and flat-top portions, such as portion 30i, may follow, as desired.

All switching mean 28-1 through 28-4 may be open-circuited prior to time $t_O$. At time $t_O$, ramp 30b commences as first switching means 28-1 and fourth switching means 28-4 are closed, responsive to signals S'1 and S'4, so that the current $I_p$ flows therethrough, respectively from terminal 10d to terminal C, and from terminal D to terminal 10e. The coil current $I_L$ rises at a rate determined from the solution of the circuit equation $V = RI_L + L(dI_L/dt)$, where R is the coil resistance, V is the high voltage from terminal 10d to terminal 10e, and L is the coil inductance. During waveform ramp portions, the RI voltage drop is small compared to the inductive drop across gradient coil 11; thus, the current rises at an approximate rate of V/L, or about 3.5 amperes/microsecond for a 1 millihenry coil at $V_1 + V_2 = 3500$ volts. When the coil current $I_L$ reaches the desired level at time $t_1$, first switching S1 means 28-1 is commanded to its open-circuit condition, while fourth switch S4 means 28-4 is left closed. Fourth switching means 28-4 is kept closed during the entire flat top portion 30c, and is open-circuited only at time $t_2$. During the flat top portion 30c, the transformer primary winding current $I_p$ "free wheels" from primary winding 22p, through closed switching means 28-4, now-conducting second reverse-conduction means (e.g. diode D2, to terminal C and thence back into the primary winding 22p. Concurrently, the data for ramp portion 30c is applied to terminal 10c, and is converted by DAC means 16 to control current $I_a$, so that the voltages across the transformer secondary windings 22S1 and 22S2 are substantially zero, and the linear amplifier 12, due to current feedback from sensor 18, and at the subtractive action of adder 14, automatically provides the voltage necessary to maintain the coil current $I_L$ amplitude needed to overcome the voltage drop across coil resistance R.

At the end of flat-top portion 30c, switch means 28-4 is commanded to the open-circuited condition by removal of control signal S'4. The free-wheeling current from the transformer primary winding continues to flow, due to the inductively stored energy in the transformer core. The free-wheeling current causes the voltage across transformer primary winding 22p to rapidly rise until that voltage reaches the high voltage supply value, between terminals 10d and 10e. When this $V_1 + V_2$ voltage is reached, reverse-conduction means D2 and D3 conduct and current thus flows from negative-polarity terminal 10e, through diode D2, to terminal C, thence through primary winding 22p to terminal D, thence through diode D3 to terminal 10d. At this time, half of the high voltage, e.g. about −1750 volts, appears across each transformer secondary winding 22S1 and 22S2, and the coil current $I_L$ ramps down at a rate of about −3.5 amps/microsecond, in portion 30d. At some time $t_a$, after switch S4 is opened and before the down-ramping current in portion 30d reaches a zero magnitude, second switch S2 means 28-2 and third switch S3 means 28-3 are commanded to the closed position by respective signals S'2 and S'3. Because the second and third switching means are closed before the coil current reaches zero magnitude, the coil current will continue to ramp through zero in the negative direction, into portion 30e. When the desired maximum negative current is reached, at time $t_4$, third switch means 28-3 is open-circuited and linear amplifier 12 holds the current during flat-top portion 30f substantially constant at the value commanded by current $I_a$ (by subtraction of feedback current $I_f$ therefrom to obtain control current $I_c$). Switching means 28-2 remains closed until the end of the flat-top portion 30f, and is open-circuited at time $t_5$, as the current begins to ramp back towards zero, in portion 30g.

It will be seen that during the entire waveform, the linear amplifier output is connected in series with the gradient coil and the transformer secondary windings. Small high voltage errors are automatically compensated for by the linear amplifier feedback circuit. Thus, as long as the commanded waveforms do not cause the linear amplifier output to go beyond its voltage range, the entire waveform is precisely controlled with current feedback from sensor 18. The linear amplifier output excess voltage will automatically account for high voltage power supply droop and for small changes in the load impedance (i.e. the impedance of gradient current 11). It will be seen that other waveform adjustments, such as for eddy current compensation and the like, are also automatic.

It will also be seen that this transformer-based speed-up circuit only need be switched on where necessary; many pulse sequence portions do not require very fast gradient switching and so the high voltage/high-speed features need not be utilized to obtain a desired gradient waveform. Thus, it will be understood that the linear amplifier can be utilized without turning on the speedup portion (sources 24 and switching means 20), so that very small gradient pulses can be more easily controlled. With the speed-up circuit 20/24 portions engaged, very small gradient pulses may be very difficult to control, as high power semiconductor switching devices, such as GTOs and the like, have minimum on-time and off-time requirements, as well as finite time delays. Preferably, if the speed-up portion is not being utilized, the transformer primary winding 22p should be short-circuited, as by commanding control signals S'1 and S'3 (or S'2 and S'4) to close switching means 28-1 and 28-3. With the transformer primary winding short circuited, the reactance seen by linear amplifier 12 can be made relatively small. As there will be no mechanical switch necessary for the shorting activity, pulse sequences can be constructed which involve very strong pulse gradients using the speed up circuit, rapidly followed by very small and precisely controlled pulses utilizing only the linear amplifier portion.

It will be seen that, while the circuit of FIG. 1 utilizes a single transformer with twin secondaries 22S2 and 22S2 which may serve to balance the gradient coil voltage, transformer means 22 can equally well be split into a pair of transformers with their primary windings connected in series between terminals C and D. However, use of a single transformer with a single primary winding 22p is preferred as the secondary windings 22S1/22S2 are forced to voltage share.

While one presently preferred embodiment of our novel invention has been described in detail herein, many modifications and variations will now become apparent to those skilled in the art. It is our intent, therefore, to be limited only by the scope of the appending claims and not by the specific details and instrumentalities presented by way of explanation herein.

What we claim is:

1. A gradient speed-up circuit, for use in a higher-speed NMR imaging system having an associated gradient coil, comprising:
   gradient power amplifier means for controlling a portion of a current flowing through an output circuit, responsive to an input signal;
   transformer means having at least first and second secondary windings for connection of said amplifier means output circuit to said gradient coil, and having at least one primary winding coupled to said at least first and second secondary windings;
   power switching means for providing a current flow through said primary winding to change the coil current responsive to a sequence of control signals; and
   means for providing to said amplifier means the input signal with an amplitude changing the amplifier output circuit current whenever the coil current lags behind an amplitude commanded by a command signal.

2. The circuit of claim 1, wherein said transformer means comprises a single transformer having a single primary winding coupled to a pair of separate secondary windings.

3. The circuit of claim 2, wherein said primary winding has a turns ratio of about 2:1 to each of said pair of separate secondary windings.

4. The circuit of claim 1, wherein said input signal providing means comprises: means for providing a command signal; means for providing a feedback signal proportional to the current flowing through said coil; and means for providing the difference between the command and feedback signals as the input signal.

5. The circuit of claim 4, wherein the command signal is a command current $I_a$ and the feedback signal is a current $I_f$.

6. The circuit of claim 5, wherein said feedback signal providing means is a current sensor located between the amplifier means output circuit and an adjacent secondary winding.

7. The circuit of claim 4, wherein said command signal is provided at an output of a DAC means.

8. The circuit of claim 4, wherein said feedback signal providing means is a current sensor located between the amplifier means output circuit and an adjacent secondary winding.

9. The circuit of claim 4, wherein the difference providing means is an arithmetical means for subtracting the amplitude of the feedback signal from the amplitude of the command signal.

10. The circuit of claim 1, further comprising means for causing a shim current to flow through said gradient coil.

11. The circuit of claim 10, wherein the current causing means causes a DC shimming current to flow.

12. The circuit of claim 10, wherein the current causing means is connected between said first and second secondary winding.

13. The circuit of claim 1, wherein said power switching means includes a plurality of individually-controllable semiconductor switching devices.

14. The circuit of claim 13, wherein the devices are arranged in a full-bridge configuration.

15. The circuit of claim 13, wherein each device is connected in parallel with a reverse-conduction element.

* * * * *